(12) United States Patent
Tateishi et al.

(10) Patent No.: US 12,127,382 B2
(45) Date of Patent: Oct. 22, 2024

(54) SEMICONDUCTOR MODULE WITH COOLING FINS IN A MATRIX FORM

(71) Applicant: FUJI ELECTRIC CO., LTD., Kawasaki (JP)

(72) Inventors: Yoshihiro Tateishi, Matsumoto (JP); Tatsuhiko Asai, Hino (JP); Takahiro Koyama, Matsumoto (JP); Hiromichi Gohara, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 255 days.

(21) Appl. No.: 17/679,867

(22) Filed: Feb. 24, 2022

(65) Prior Publication Data
US 2022/0183194 A1    Jun. 9, 2022

Related U.S. Application Data

(63) Continuation of application No. PCT/JP2021/002072, filed on Jan. 21, 2021.

(30) Foreign Application Priority Data

Mar. 18, 2020  (JP) ................................ 2020-047766

(51) Int. Cl.
*H05K 7/20*     (2006.01)
*H01L 23/367*   (2006.01)
(Continued)

(52) U.S. Cl.
CPC ..... *H05K 7/20927* (2013.01); *H01L 23/3677* (2013.01); *H01L 23/473* (2013.01);
(Continued)

(58) Field of Classification Search
CPC ........... H05K 7/20218; H05K 7/20254; H05K 7/2039; H05K 7/20436; H05K 7/20845;
(Continued)

(56) References Cited

U.S. PATENT DOCUMENTS 8,618,585 B2 * 12/2013  Sato ........................ H01L 24/01
                                                257/E23.101
9,502,329 B2    11/2016  Nagaune
                    (Continued)

FOREIGN PATENT DOCUMENTS

JP    2009-176881    8/2009
JP    2018-133350    8/2018
              (Continued)

OTHER PUBLICATIONS

Written Opinion of the International Searching Authority, dated Apr. 3, 2021, in International Application No. PCT/JP2021/002072 (5 pp.).

(Continued)

*Primary Examiner* — Zachary Pape
*Assistant Examiner* — Steven Ngo

(57) ABSTRACT

A semiconductor module includes a cooling device that includes: a ceiling plate; a side wall; a bottom plate; a plurality of pin fins having a polygonal shape and arranged in a matrix form in which one end of the respective pin fins is connected to a fin region having a rectangular shape; an inlet for a coolant at a first position adjacent to a part of one of long sides of the fin region, and an outlet for the coolant at a second position adjacent to a part of the other long side of the fin region. The matrix directions of the respective pin fins make an angle with a straight line connecting the first position and the second position, and a length of a segment of the straight line passing across the fin region is longer than a length of short sides of the fin region.

14 Claims, 10 Drawing Sheets

(51) Int. Cl.
*H01L 23/473* (2006.01)
*H01L 25/07* (2006.01)
*H01L 25/18* (2023.01)

(52) U.S. Cl.
CPC ........ *H05K 7/20254* (2013.01); *H01L 25/072* (2013.01); *H01L 25/18* (2013.01)

(58) Field of Classification Search
CPC ........... H05K 7/20854; H05K 7/20872; H05K 7/2089; H05K 7/209; H05K 7/20927; H05K 2201/064; H05K 23/367; H05K 23/3677; H05K 23/473; H01L 2023/4037; H01L 2023/4043; H01L 2023/405
See application file for complete search history.

(56) References Cited

U.S. PATENT DOCUMENTS

| | | | |
|---|---|---|---|
| 9,871,006 B2 | 1/2018 | Kato et al. | |
| 11,129,310 B2 | 9/2021 | Arai | |
| 11,856,739 B2* | 12/2023 | Ruppert | H05K 7/20927 |
| 2003/0048611 A1* | 3/2003 | Skofljanec | H05K 7/20854 |
| | | | 361/719 |
| 2009/0250195 A1* | 10/2009 | Yoshida | H01L 23/473 |
| | | | 361/702 |
| 2011/0297361 A1* | 12/2011 | Carbone | H01L 31/0521 |
| | | | 165/185 |
| 2012/0279761 A1* | 11/2012 | Hori | H01L 23/3735 |
| | | | 228/122.1 |
| 2014/0043765 A1* | 2/2014 | Gohara | H01L 23/473 |
| | | | 361/699 |
| 2014/0054762 A1 | 2/2014 | Nagaune | |
| 2014/0091453 A1* | 4/2014 | Mori | F28F 13/06 |
| | | | 165/104.33 |
| 2014/0376184 A1* | 12/2014 | Gohara | H05K 7/20254 |
| | | | 361/689 |
| 2015/0021756 A1* | 1/2015 | Adachi | H05K 7/20927 |
| | | | 257/714 |
| 2016/0358864 A1 | 12/2016 | Kato et al. | |
| 2018/0024599 A1* | 1/2018 | Sakata | F28F 3/06 |
| | | | 361/679.47 |
| 2019/0137195 A1* | 5/2019 | Arata | H05K 7/20 |
| 2019/0304874 A1* | 10/2019 | Arai | H02M 7/003 |
| 2019/0360764 A1* | 11/2019 | Liu | F28F 3/06 |
| 2019/0363036 A1 | 11/2019 | Arai | |
| 2020/0170147 A1* | 5/2020 | Arai | H01L 23/473 |
| 2020/0266126 A1* | 8/2020 | Arai | H05K 7/209 |
| 2020/0279789 A1* | 9/2020 | Williams | H01L 23/3677 |
| 2020/0388557 A1* | 12/2020 | Yoo | H01L 23/3735 |

FOREIGN PATENT DOCUMENTS

| | | |
|---|---|---|
| JP | 2019-204922 | 11/2019 |
| JP | 2020-35927 | 3/2020 |
| JP | 2020-92250 | 6/2020 |
| WO | 2012/157247 | 11/2012 |
| WO | 2016/042903 | 3/2016 |

OTHER PUBLICATIONS

English translation of International Search Report, dated Apr. 3, 2021, in International Application No. PCT/JP2021/002072 (3 pp.).

* cited by examiner

SEMICONDUCTOR MODULE WITH COOLING FINS IN A MATRIX FORM

CROSS-REFERENCE TO RELATED APPLICATION

This application is a Continuation of PCT Application No. PCT/JP2021/002072, filed on Jan. 21, 2021, and claims the priority of Japanese Patent Application No. 2020-047766, filed on Mar. 18, 2020, the content of both of which is incorporated herein by reference.

BACKGROUND

1. Field of the Invention

The present invention relates to a semiconductor module.

2. Description of the Related Art

A semiconductor module is known that includes a cooling device provided with cooling fins (for example, Patent Literature 1: WO 2012/157247 A1).

SUMMARY

The semiconductor module disclosed in WO 2012/157247 A1 has a problem with a flow-rate distribution of a coolant in the cooling device which is not small enough.

In order to solve the foregoing problems, an aspect of the present invention inheres in a semiconductor module including a cooling device, the cooling device including: a ceiling plate; a side wall connected to the ceiling plate; a bottom plate opposed to the ceiling plate and connected to the side wall; a plurality of pin fins having a polygonal shape and arranged separately from each other in a matrix form in a planar view in which one end of the respective pin fins is connected to a fin region having a rectangular shape and separated from the side wall on a surface of the ceiling plate opposed to the bottom plate; an inlet for a coolant having a center of a flow path at a position adjacent to a part of one of long sides of the fin region in the planar view; and an outlet for the coolant having a center of a flow path at a position adjacent to a part of another one of the long sides of the fin region in the planar view, wherein matrix directions of the respective pin fins make an angle with a straight line connecting the position of the inlet and the position of the outlet, and a length of a segment of the straight line passing across the fin region is longer than a length of short sides of the fin region.

DETAILED DESCRIPTION

The explanations are made below with reference to some embodiments of the present invention, but the following embodiments are not intended to limit the present invention as recited in the appended claims.

It should be understood that all of the combinations of the features described in the following embodiments are not necessarily required for the problems to be solved by the present invention.

Figure 1:
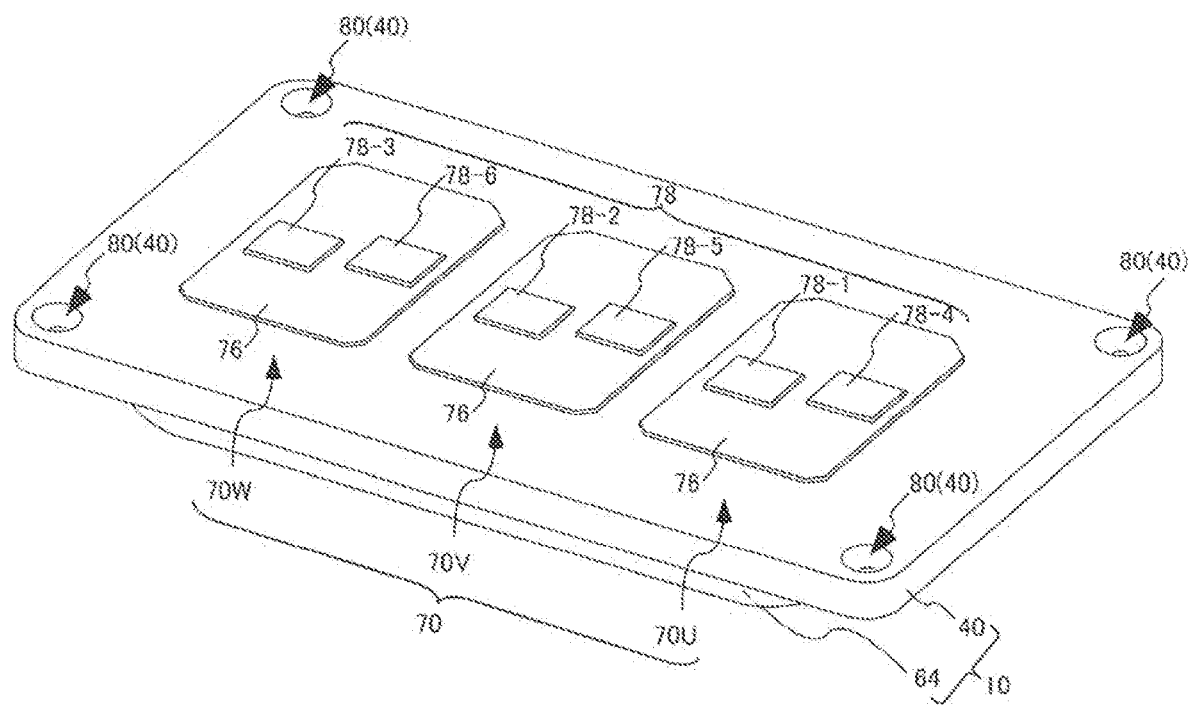
FIG. 1 is a schematic perspective view illustrating a semiconductor module 100 according to an embodiment of the present invention.
Figure 2:
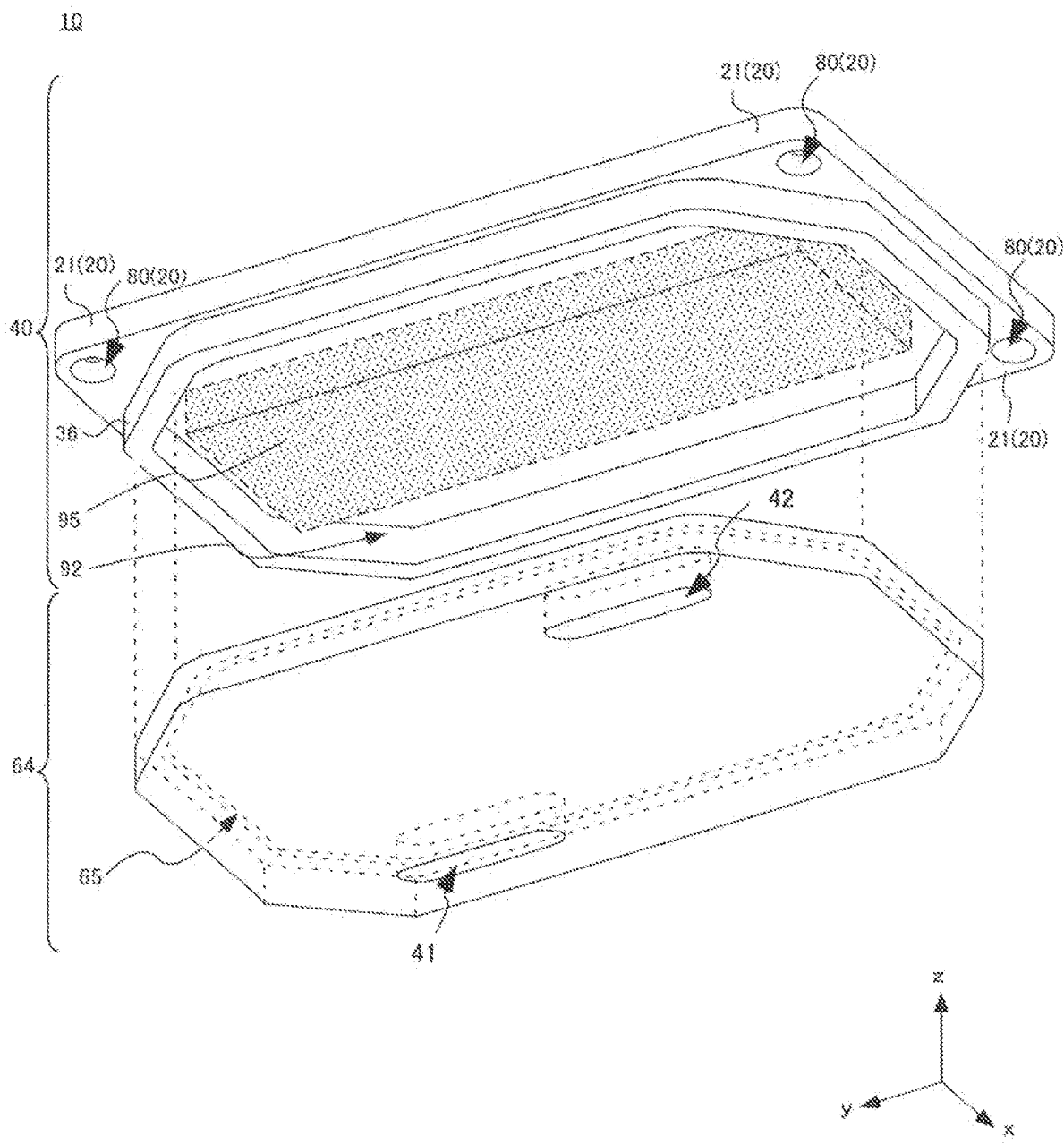
FIG. 2 is a schematic perspective view illustrating a cooling device 10 of the semiconductor module 100 according to the embodiment of the present invention.
Figure 3:
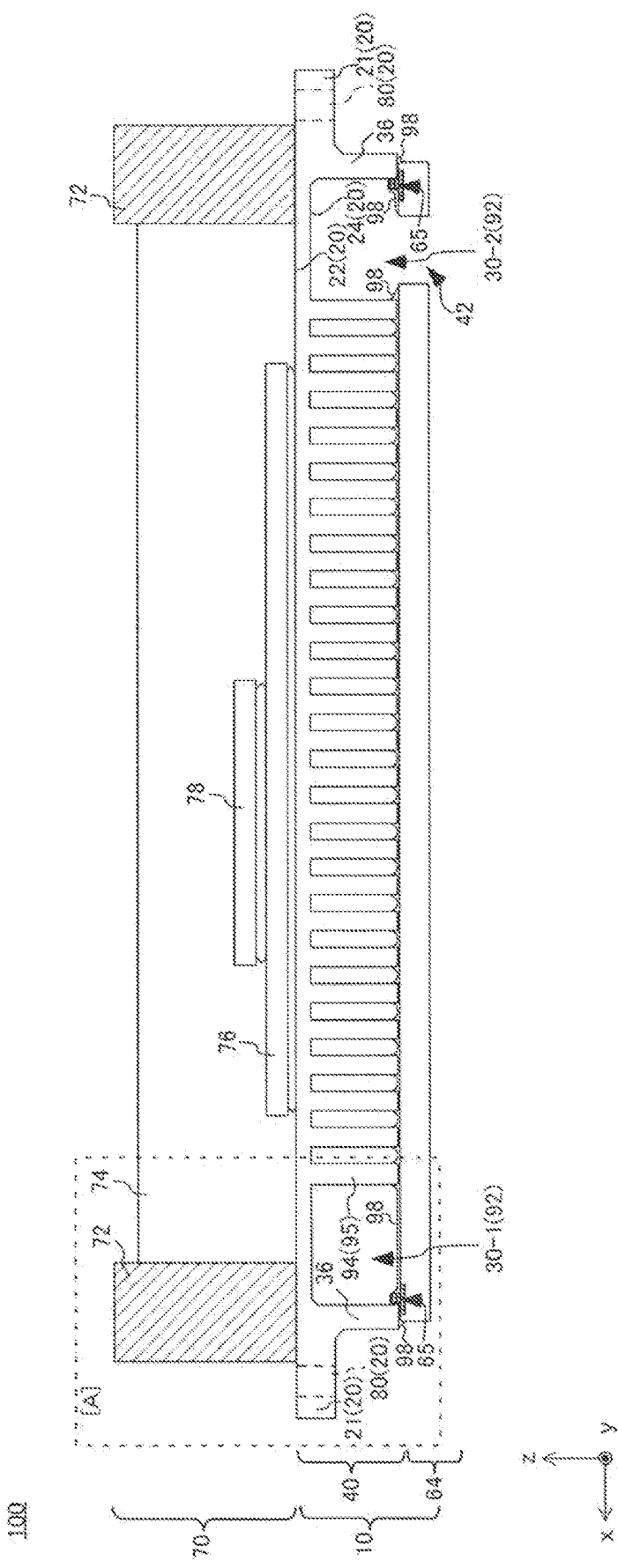
FIG. 3 is a schematic cross-sectional view illustrating the semiconductor module 100 according to the embodiment of the present invention.
Figure 4:
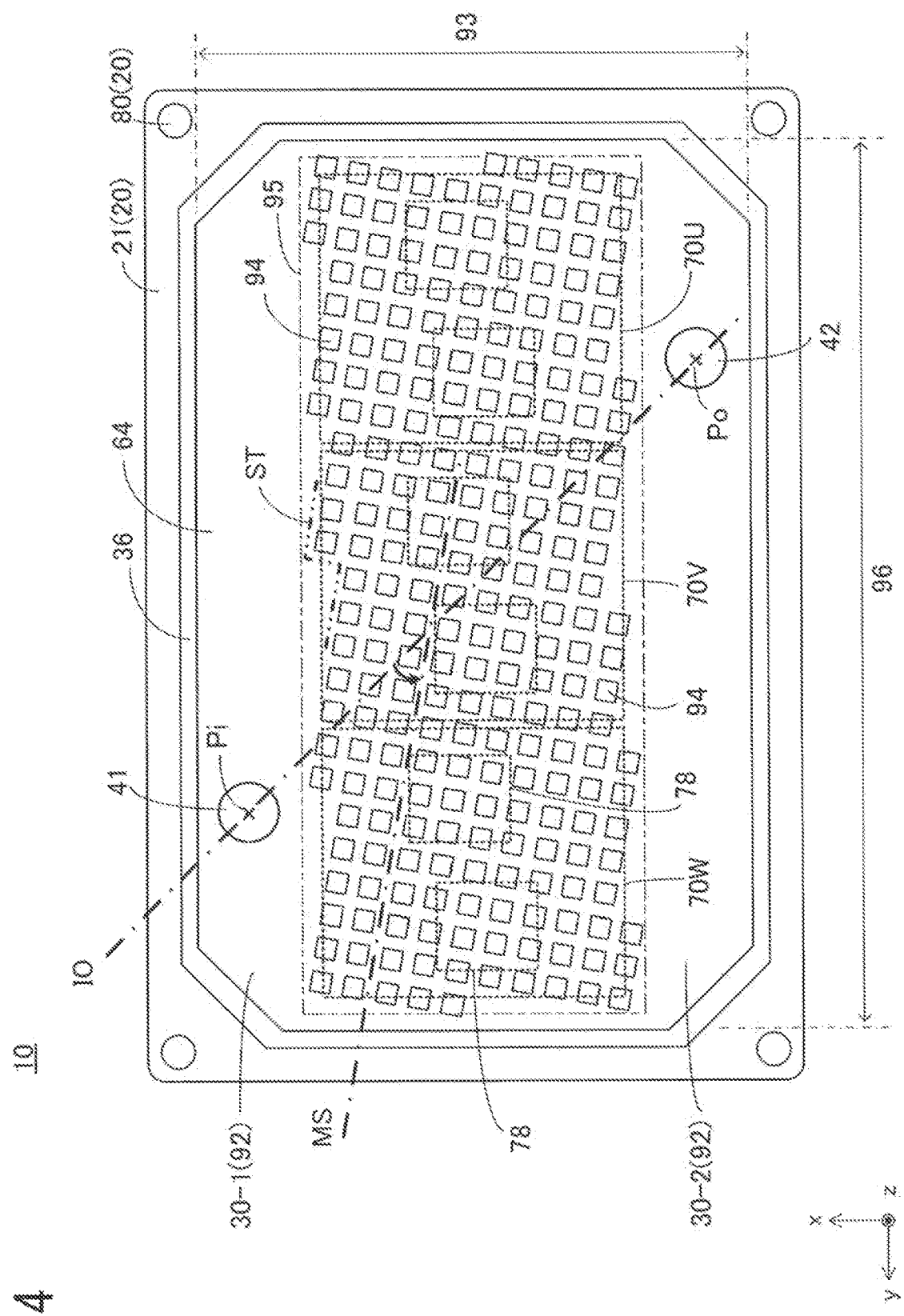
FIG. 4 is a view illustrating an example of arrangement of a fin region 95 of a cooling device 10 and assemblies 70U, 70V, and 70W, a configuration of pin fins 94, and a flowing direction of a coolant in the semiconductor module 100 according to the embodiment of the present invention.

FIG. 1 is a schematic perspective view illustrating an example of a semiconductor module 100 according to an embodiment of the present invention, and FIG. 2 is a schematic perspective view illustrating an example of a cooling device 10 of the semiconductor module 100. FIG. 3 is a schematic cross-sectional view illustrating an example of the semiconductor module 100 according to the embodiment of the present invention, and FIG. 4 is a view illustrating an example of arrangement of a fin region 95 of the cooling device 10 and a semiconductor device 70, a configuration of pin fins 94, and a flowing direction of a coolant in the semiconductor module 100 according to the embodiment of the present invention. FIG. 3 shows a virtually cross-sectioned state of a semiconductor chip 78 of a U-phase assembly 70U in the semiconductor module 100 illustrated in FIG. 1 and an outlet 42 of the cooling device 10 illustrated in FIG. 2 on the x-z plane. FIG. 4 indicates the U-phase assembly 70U, a V-phase assembly 70V, and a W-phase assembly 70W illustrated in FIG. 1 by the broken lines. FIG. 3 indicates a region [A] by the broken line that is enlarged in FIG. 12 described below.

As illustrated in FIG. 1 to FIG. 4, the semiconductor module 100 includes the cooling device 10. The semiconductor device 70 is mounted on the cooling device 10 of this example. The present embodiment is illustrated with a case in which the surface of the cooling device 10 on which the semiconductor device 70 is mounted is defined as the x-y plane, and the axis perpendicular to the x-y plane is defined as a z-axis. The respective x, y, and z axes represent the right-hand system. While the present embodiment is illustrated with a case in which the direction from the cooling device 10 toward the semiconductor device 70 in the z-axis direction is defined as an upward direction and the opposite direction is defined as a downward direction, the respective upward and downward directions are not limited to the gravity direction. The surface on the upper side of the respective members in the present embodiment is referred to as a top surface, the surface on the lower side is referred to as a bottom surface, and the surface between the top surface and the bottom surface is referred to as a side surface. In the explanations of the present embodiment, the planar view refers to a state in which the semiconductor module 100 is viewed in the positive direction of the z-axis.

The semiconductor device 70 includes circuit substrates 76 each equipped with semiconductor chips 78. The semiconductor device 70 of this example may include three circuit substrates 76, and the respective circuit substrates 76 may be equipped with two semiconductor chips 78. The semiconductor device 70 of this example is a power semiconductor device, and may include the U-phase assembly 70U including the circuit substrate 76 and the semiconductor chips 78-1 and 78-4, the V-phase assembly 70V including the circuit substrate 76 and the semiconductor chips 78-2 and 78-5, and the W-phase assembly 70W including the circuit substrate 76 and the semiconductor chips 78-3 and 78-6. The semiconductor module 100 of this example may serve as a device implementing a three-phase alternating-current inverter. The respective semiconductor chips 78 in the U-phase assembly 70U, the V-phase assembly 70V, and the W-phase assembly 70W serve as a heat-generating source that generates heat when the semiconductor module 100 is operated.

The respective semiconductor chips 78 are a vertical semiconductor element, and include a top-surface electrode and a bottom-surface electrode. The respective semiconductor chips 78 include an element such as an insulated gate bipolar transistor (IGBT), a metal-oxide-semiconductor field-effect transistor (MOSFET), and a freewheeling diode (FWD) formed on a semiconductor substrate of silicon, for example. The respective semiconductor chips 78 may be a reverse-conducting IGBT (RC-IGBT) in which an IGBT and a FWD are formed on a single semiconductor substrate. The IGBT and the FWD may be connected antiparallel to each other in the RC-IGBT.

The bottom-surface electrodes of the semiconductor chips 78 are connected to the top surfaces of the respective circuit substrates 76. The top-surface electrodes of the respective semiconductor chips 78 may each be any of an emitter electrode, a source electrode, or an anode electrode, and the bottom-surface electrodes may each be any of a collector electrode, a drain electrode, or a cathode electrode. The semiconductor substrate of the respective semiconductor chips 78 may be a silicon carbide (SiC) or a gallium nitride (GaN).

The respective semiconductor chips 78 including the switching element such as the IGBT and the MOSFET include a control electrode. The semiconductor module 100 may include a control terminal connected to the control electrode of the respective semiconductor chips 78. The switching elements may be controlled by an external control circuit via the control terminals.

The circuit substrates 76 are each a stacked substrate sequentially including an insulating plate having a top surface and a bottom surface, a circuit layer provided on the top surface of the insulating plate, and a metal layer provided on the bottom surface of the insulating plate. The circuit substrates 76 each have a top surface and a bottom surface and are arranged such that the bottom surface is located on the top surface of the cooling device 10. The respective circuit substrates 76 are fixed to the top surface of the cooling device 10 via the metal layer by soldering, for example. The two semiconductor chips 78 are fixed to the top surface of each circuit substrate 76 via the circuit layer, for example.

The circuit substrate 78 may be a direct copper bonding (DCB) substrate or an active metal brazing (AMB) substrate. The insulating plate may be formed of ceramic material such as alumina ($Al_2O_3$), aluminum nitride (AlN), and silicon nitride ($Si_3N_4$). The circuit layer and the metal layer may each be formed of a plate member including conductive material such as copper or a copper alloy. The circuit layer is fixed to the top surface of the insulating plate by soldering or brazing. The respective semiconductor chips 78 are electrically and mechanically connected to the top surface of the circuit layer by soldering, namely, directly connected in an electrical-circuit state. The respective semiconductor chips 78 and the circuit layer may be electrically connected to any other conductive member such as main terminals via wires, for example.

The cooling device 10 includes a base plate 40 and a bottom plate 64. The base plate 40 includes a ceiling plate 20 on which the semiconductor device 70 is mounted, a side wall 36 connected to the ceiling plate 20, and a plurality of pin fins 94 connected to the ceiling plate 20. One end of the respective pin fins 94 is connected to a rectangular fin region 95 on the surface of the ceiling plate 20 opposed to the bottom plate 64 and separated from the side wall 36. The respective pin fins 94 are arrange separately from each other in a matrix form in the planar view.

The ceiling plate 20 is a plate-like member having a main surface extending on the x-y plane. The ceiling plate 20 of this example has a substantially rectangular shape having the long sides and the short sides in the planar view. The respective short sides of the ceiling plate 20 of this example are parallel to the x-axis, and the respective long sides are parallel to the y-axis. The ceiling plate 20 includes a fastening part 21 used for fastening the semiconductor module 100 to an external device to which the semiconductor module 100 is mounted. The fastening part 21 is located on the outside of the side wall 36 connected to the ceiling plate 20 in the planar view, and has penetration holes 80 in which bolts and the like in the external device are inserted. The fastening part 21 of this example has four penetration holes 80 located at the respective four corners of the ceiling plate 20 having a substantially rectangular shape.

The side wall 36 has a substantially uniform thickness, and serves as a side surface of the cooling device 100. The side wall 36 of this example has a substantially rectangular outline having the long sides and the short sides on the x-y plane. Since the side wall 36 serves as the side surface of the cooling device 100, the respective short sides of the outline of the side wall 36 are parallel to the x-axis, and the respective long sides are parallel to the y-axis. The side wall 36 of this example is located on the inside of the fastening part 21 of the ceiling plate 20 in the planar view, and extends in the negative direction of the z-axis from the ceiling plate 20.

The fin region 95 is provided with the plural pin fins 94. The arrangement of the pin fins 94 defines flow paths for a coolant. The respective pin fins 94 are substantially formed into a rhombus shape in cross section on the x-y plane. The single or plural pin fins 94 can be simply referred to below as pin fins 94. The pin fins 94 extend from the ceiling plate 20 in the negative direction of the z-axis. The pin fins 94 are located on the inside of the side wall 36 so as to be surrounded by the side wall 36. The respective pin fins 94 may be arranged at regular intervals in the fin region 95. The interval between the respective pin fins 94 may be 0.6 millimeters or greater and 2.0 millimeters or smaller, for example.

The fin region 95 in which the pin fins 94 are provided in the cooling device 10 illustrated in FIG. 2 is indicated by the dotted line, instead of the illustration of the pin fins 94 for brevity. The fin region 95 may have a rectangular shape in a planar view, in which the respective short sides are parallel to the x-axis, and the respective long sides are parallel to the y-axis.

The ceiling plate 20, the side wall 36, and the pin fins 94 in the base plate 40 of this example are integrally formed together. For example, the ceiling plate 20, the side wall 36, and the pin fins 94 may be integrally formed of a single continuous plate member. The single continuous plate member may be subjected to punching with a metal die having a shape corresponding to the ceiling plate 20, the side wall 36, and the pin fins 94 so as to be integrally formed together, for example. Alternatively, the ceiling plate 20, the side wall 36, and the pin fins 94 may be molded by cooling forging under a room-temperature condition by impact pressing or any forging means such as warm forging, hot forging, and molten forging under a high-temperature condition, or may be molded by casting so as to be integrally formed together. The semiconductor module 100 according to the present embodiment in which the ceiling plate 20, the side wall 36, and the pin fins 94 are integrally formed together can contribute to a decrease in the number of the components as compared with a case in which a plurality of components formed independently of each other are fixed to each other.

The bottom plate 64 is a plate-shaped member. The bottom plate 64 of this example has a substantially rectangular shape having the long sides and the short sides in the planar view. The short sides of the bottom plate 64 of this example are parallel to the x-axis, and the long sides are parallel to the y-axis. The bottom plate 64 serves as a bottom surface of a coolant flow part 92. The bottom plate 64 is connected to the side wall 36 so as to face the ceiling plate 20.

The ceiling plate 20, the side wall 36, and the bottom plate 64 define the coolant flow part 92 through which the coolant flows. In particular, the side wall 36 is arranged to surround the coolant flow part 92 on the x-y plane, and the ceiling plate 20 and the bottom plate 64 are arranged to face each other in the z-axis direction to interpose the coolant flow part 92. The outline of the coolant flow part 92 on the x-y plane is thus defined by the inner circumference of the side wall 36 so that the coolant flow part 92 has a substantially rectangular shape having the long sides and the short sides on the x-y plane.

The bottom plate 64 of this example is provided with an inlet 41 that is a penetration hole for introducing the coolant into the coolant flow part 92 and an outlet 42 that is a penetration hole for leading the coolant to the outside of the coolant flow part 92. The inlet 41 and the outlet 42 are not necessarily provided in the bottom plate 64. For example, the inlet 41 and the outlet 42 may be formed on the side wall 36 of the base plate 40. The bottom plate 64 of this example may also be provided with a stepped part 65 for defining a position to which the side wall 36 is fixed on the side opposed to the ceiling plate 20. The outline of the stepped part 65 of this example may be smaller than the outline of the bottom plate 64 and have a substantially rectangular shape having the long sides and the short sides in the planar view as the bottom plate 64. The short sides of the stepped part 65 of this example may be parallel to the x-axis, and the long sides may be parallel to the y-axis. The bottom plate 64 may be provided with any other step capable of defining the position to which the side wall 36 is fixed, instead of the stepped part 65 illustrated in FIG. 2 to FIG. 4, for example. The base plate 64 is not necessarily provided with the stepped part 65.

The inlet 41 and the outlet 42 can each be connected with a pipe communicating with an external coolant supply source. In other words, the cooling device 10 can be connected to the external coolant supply source via two pipes. The coolant thus can be introduced into the cooling device 10 through one pipe via the inlet 41, and can be discharged to the other pipe via the outlet 42 after being circulated inside the coolant flow part 92. The bottom plate 64 and the coolant supply source may be connected to each other via sealing members arranged at the respective circumferences of the inlet 41 and the outlet 42.

The inlet 41 and the outlet 42 are located on one side and the other side of the cooling device 10 in the x-axis direction, and are located on one side and the other side of the cooling device 10 in the y-axis direction. In particular, the inlet 41 and the outlet 42 are located at both ends opposed to each other in the coolant flow part 92 in the diagonal direction of the coolant flow part 92 having the substantially rectangular shape on the x-y plane. The inlet 41 and the outlet 42 may be provided respectively in a first header 30-1 and a second header 30-2. The inlet 41 and the outlet 42 may be arranged respectively at a position Pi and a position Po on the outside of the fin region 95. The outlet 42 may be located on the opposite side of the inlet 41 about the fin region 95 separately from the inlet 41 in the long-side direction of the fin region 95. A length L1 of a segment of a straight line IO passing across the fin region 95 and connecting the position Pi and the position Po is longer than a length L2 of the short side 93 of the fin region 95. The straight line IO may make an angle with the short side of the fin region 95 that is 30 degrees or greater and 60 degrees or smaller, preferably substantially 45 degrees. The inlet 41 and the outlet 42 may each have an opening having a circular shape, a rectangular shape having rounded corners, or an oval shape in the planar view. The position Pi and the position Po are defined by the centers of the openings of the inlet 41 and the outlet 42. The inlet 41 has the center of the flow path at the position Pi adjacent to a part of one of the long sides 96 of the fin region 95 in the planar view. The outlet 42 has the center of the flow path at the position Po adjacent to a part of the other long side 96 of the fin region 95 in the planar view.

The semiconductor module 100 according to the present embodiment effectively cools heat generated in the respective semiconductor chips 78 aligned in the y-axis direction on the top surface of the cooling device 10 by the coolant that is introduced into the coolant flow part 92 via the inlet 41 of the cooling device 10, is diffused over the entire coolant flow part 92, and flows out via the outlet 42. The semiconductor chips 78 each have a square shape (a rectangular shape) in the planar view, and are arranged to partly overlap with the fin region 95 in the planar view so that the longitudinal direction of the semiconductor chips 78 corresponds to the short-side direction of the fin region 95.

As illustrated in FIG. 3, the ceiling plate 20 has a top surface (a front surface) 22 and a bottom surface (a rear surface) 24 parallel to the x-y plane. The ceiling plate 20 is made of metal, for example, and more particularly, is made of metal including aluminum. The ceiling plate 20 may include a plated layer such as nickel on its surface. The semiconductor device 70 is mounted on the top surface 22 of the ceiling plate 20. The respective circuit substrates 76 of the semiconductor device 70 in this case may be directly fixed to the top surface 22 of the ceiling plate 20 by soldering. The heat generated in the respective semiconductor chips 78 is transmitted to the ceiling plate 20. The ceiling plate 20, the circuit substrates 76, and the semiconductor chips 78 are stacked in this order in the positive direction of the z-axis. The region between the ceiling plate 20 and the respective circuit substrates 76 and the region between the circuit substrates 76 and the respective semiconductor chips 78 may be thermally connected to each other. The respective members, when fixed to each other by soldering, are thermally connected to each other via the soldering.

The semiconductor device 70 may additionally include a housing part 72. The housing part 72 is a frame body formed of insulating material such as thermosetting resin or UV-curing resin, and may be provided to surround a region in which the circuit substrates 76 and the like are arranged on the top surface 22 of the ceiling plate 20. The housing part 72 may be bonded to the top surface 22 of the ceiling plate 20. The housing part 72 defines an internal space that can house the semiconductor chips 78, the circuit substrates 76, and the other circuit elements. The housing part 72 may house the respective constituent elements including the circuit substrates 76 and the semiconductor chips 78 of the semiconductor device 70 in the internal space. The internal space of the housing part 72 may be filled with a sealing member 74 for sealing the semiconductor chips 78, the circuit substrates 76, and the other circuit elements. The sealing member 74 is an insulating member including resin such as silicone gel or epoxy resin. FIG. 1 omits the illustration of the housing part 72 and the sealing member 74 for brevity.

The coolant flow part 92 is arranged toward the bottom surface 24 of the ceiling plate 20. As illustrated in FIG. 4, the coolant flow part 92 has a substantially rectangular shape having the long sides 96 and the short sides 93 in cross section parallel to the main surface of the ceiling plate 20.

The coolant such as a long life coolant (LLC) (an antifreeze) or water flows through the coolant flow part 92. The coolant is introduced from the inlet 41 communicating with one side of the coolant flow part 92 in the direction of the short sides 93 and is led out from the outlet 42 communicating with the other side in the direction of the short side 93. The coolant comes in contact with the bottom surface 24 of the ceiling plate 20 on which the circuit substrates 76 are provided and the respective pin fins 94 so as to cool the semiconductor device 70.

The coolant flow part 92 may be a sealed space in contact with each of the ceiling plate 20, the side wall 36, and the bottom plate 64. The bottom plate 64 is arranged to be directly or indirectly attached tightly to the lower end of the side wall 36 in the negative direction of the z-axis so as to seal the coolant flow part 92 by the ceiling plate 20, the side wall 36, and the bottom plate 64. The phrase "indirectly tightly attached" as used herein refers to a state in which the lower end of the side wall 36 and the bottom plate 64 are tightly attached to each other via a binder 98 such as a sealing material, an adhesive, a brazing material, or any other material provided between the side wall 36 and the bottom plate 64. The term "tightly attached" as used herein refers to a state in which the coolant inside the coolant flow part 92 does not leak out of the sealed part. The lower end of the side wall 36 and the bottom plate 64 are preferably fixed to each other by brazing. The base plate 40 and the bottom plate 64 may be formed of metal having the same constitution, and the brazing material may be formed of metal having a lower melting point than the base plate 40, such as metal including aluminum, for example.

The pin fins 94 are arranged in the coolant flow part 92 within the fin region 95, and extend between the ceiling plate 20 and the bottom plate 64. The respective pin fins 94 of this example extend in the z-axis direction such that the axis of the respective pin fins 94 substantially intersects with the respective main surfaces of the ceiling plate 20 and the bottom plate 64. As illustrated in FIG. 4, the respective pin fins 94 of this example are arranged in a grid state on the x-y plane, and extend in the z-axis direction substantially perpendicularly to the respective main surfaces of the ceiling plate 20 and the bottom plate 64.

The respective pin fins 94 have a polygonal shape such as a quadrilateral shape including a rhombus shape, a square shape, and a rectangular shape, or a hexagonal shape. For example, the respective pin fins 94 of this example may have a substantially rhombus shape in cross section on the x-y plane. The respective pin fins 94 may have the corners having an angle of 90 degrees. The lengths of a pair of the diagonal lines of the respective rhombus shapes may be either the same as or different from each other.

The plural pin fins 94 are provided at regular intervals such that the respective one sides are parallel to a main flow direction MS. The main flow direction MS is a direction that makes an angle of greater than −45 degrees and less than 45 degrees with the straight line IO. The respective pin fins 94 are arranged such that the respective matrix directions make an angle with the straight line IO. The respective one sides of the respective pin fins 94 parallel to the matrix directions of the pin fins 94 make an angle of −40 degrees or greater and −20 degrees or less or an angle of 10 degrees or greater and 40 degrees or less with the straight line IO.

Figure 5:
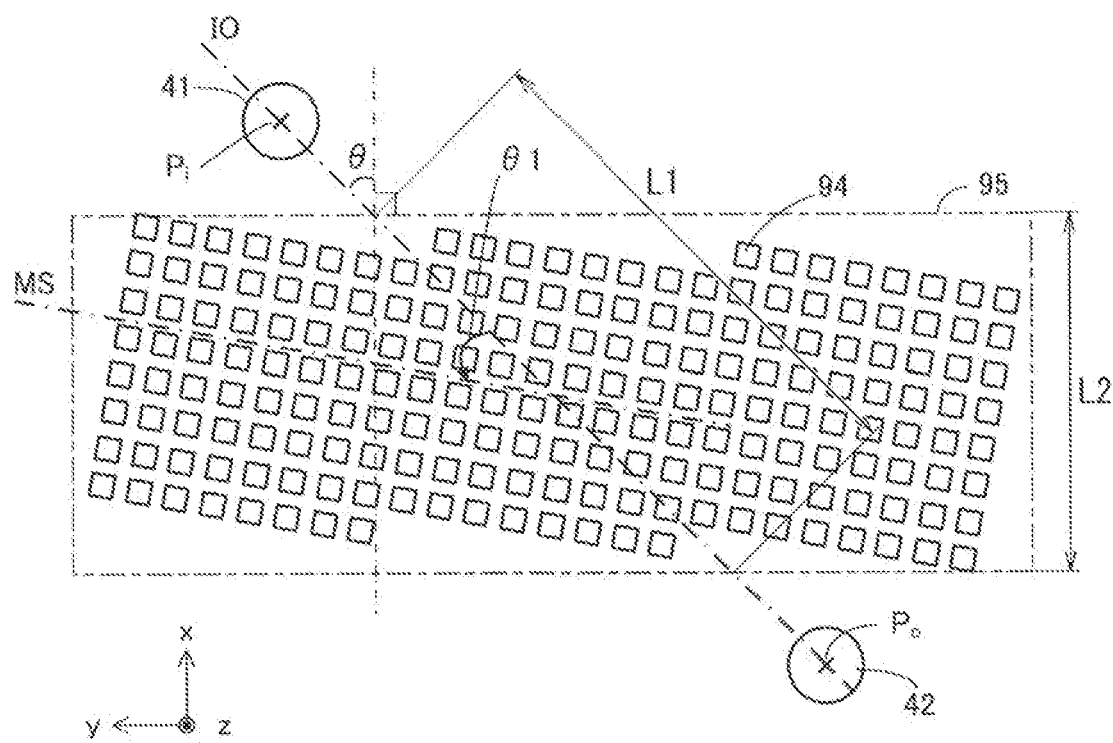
FIG. 5 is a view illustrating an example of arrangement of the fin region 95, an inlet 41, an outlet 42, and the pin fins 94 in the cooling device 10.
Figure 6:
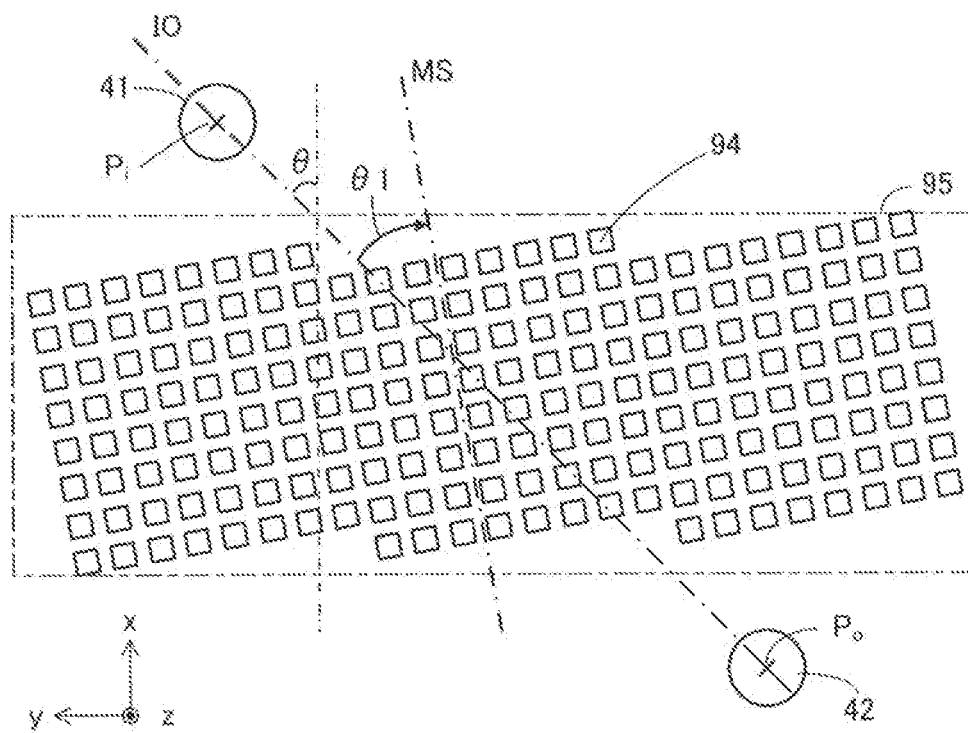
FIG. 6 is a view illustrating another example of the arrangement of the fin region 95, the inlet 41, the outlet 42, and the pin fins 94 in the cooling device 10.
Figure 7:
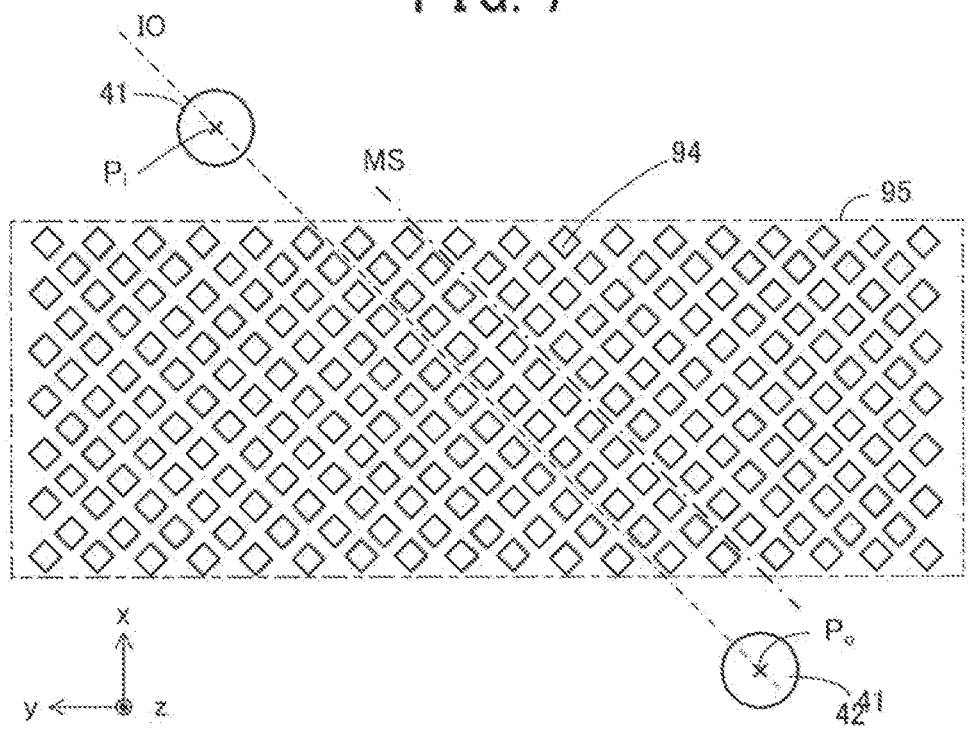
FIG. 7 is a view illustrating a referential example of the arrangement of the fin region 95, the inlet 41, the outlet 42, and the pin fins 94 in the cooling device 10.

FIG. 5 to FIG. 7 are views each showing an example of the arrangement of the fin region 95, the inlet 41, the outlet 42, and the pin fins 94. FIG. 5 illustrates a case in which the respective pin fins 94 are arranged such that the main flow direction MS makes an angle $\theta 1$ of about 35 degrees with the straight line IO. FIG. 6 illustrates a case in which the respective pin fins 94 are arranged such that the main flow direction MS makes the angle $\theta 1$ of about −35 degrees with the straight line IO. FIG. 7 illustrates a case in which the respective pin fins 94 are arranged such that the main flow direction MS makes an angle of zero degrees with the straight line IO.

Figure 8:
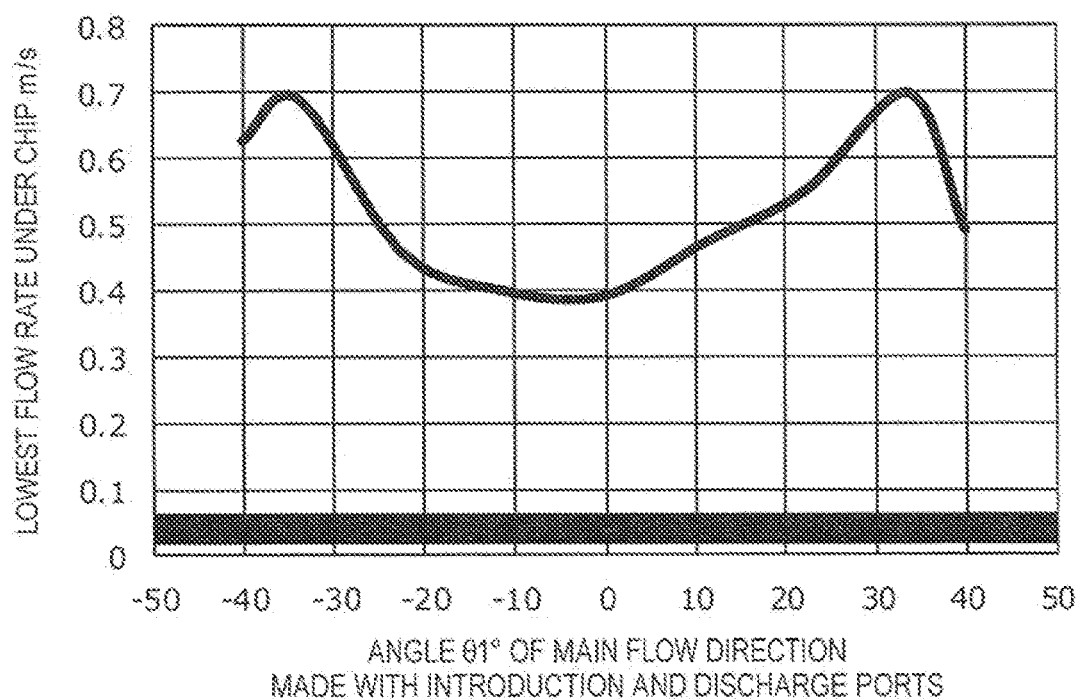
FIG. 8 is a graph showing a relation between an angle θ1 (degrees) made between a straight line IO and a main flow direction MS and a flow rate of the coolant.

FIG. 8 is a graph showing a relation between a flow rate of the coolant and the angle $\theta 1$ (degrees) made between the straight line IO connecting the respective centers of the inlet 41 and the outlet 42 and the main flow direction MS of the coolant. The flow rate of the coolant is a lowest value of the flow rate immediately under the six semiconductor chips 78 arranged in the y-axis direction as illustrated in FIG. 4. The flow rate of the coolant was obtained through a computational fluid simulation. As clear from the graph, the lowest flow rate of the coolant is improved when the angle of the main flow direction MS is in the range of −40 degrees or greater and −20 degrees or less or 10 degrees or greater and 40 degrees or less as compared with the case in which the angle of the main flow direction MS is zero degrees, and is further improved when the angle of the main flow direction MS is in the range of −40 degrees or greater and −30 degrees or less or 30 degrees or greater and 40 degrees or less.

Another simulation for evaluating a thermal resistance value immediately under the six semiconductor chips 78 revealed that the semiconductor module 10 in which the angle of the main flow direction MS is 35 degrees could improve thermal performance and reduce a pressure loss as compared with the case in which the angle of the main flow direction MS is zero degrees.

Figure 9:
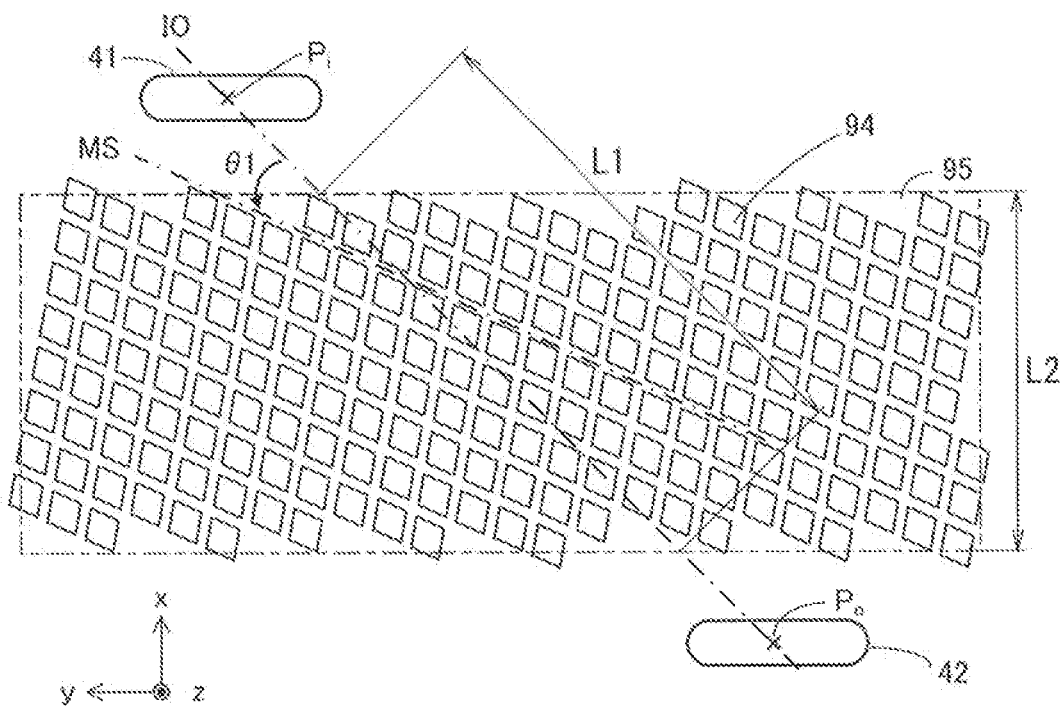
FIG. 9 is a view illustrating a modified example of the arrangement of the fin region 95, the inlet 41, the outlet 42, and the pin fins 94 in the cooling device 10.

FIG. 9 is a view showing a modified example of the arrangement of the fin region 95, the inlet 41, the outlet 42, and the pin fins 94 in the cooling device 10. The respective pin fins 94 having a rhombus shape may have diagonal lines having different lengths and have corners with an angle of greater than 60 degrees and less than 90 degrees on the x-y plane.

Figure 10:
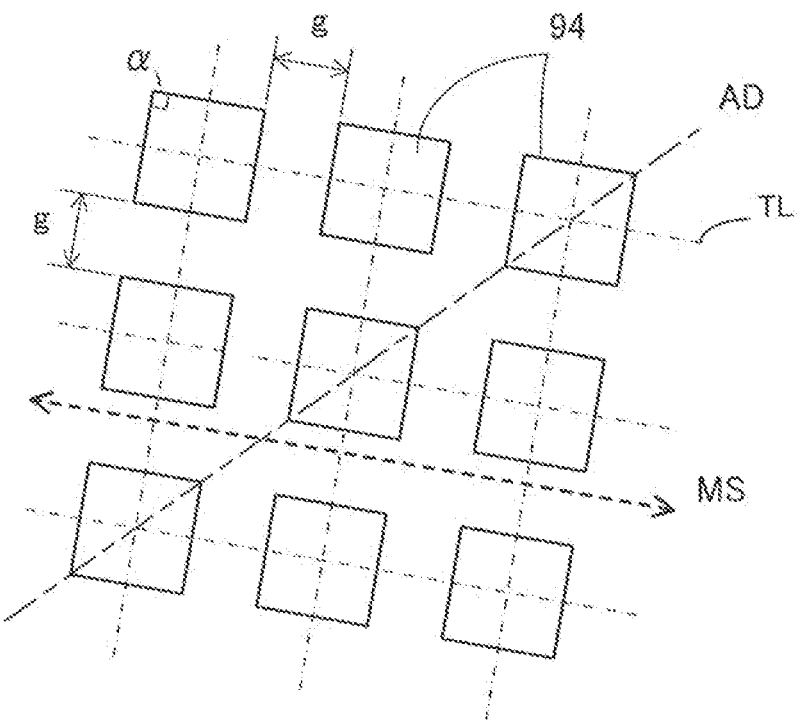
FIG. 10 is an enlarged view of the pin fins 94.
Figure 11:
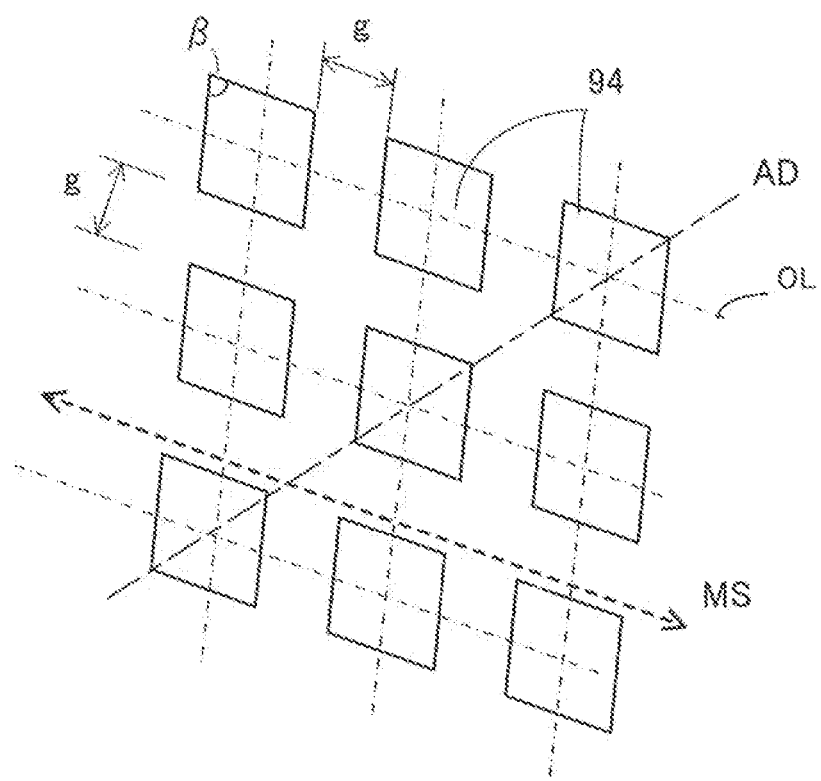
FIG. 11 is an enlarged view showing another example of the pin fins 94.

FIG. 10 and FIG. 11 are each an enlarged view of the pin fins 94. FIG. 10 illustrates the rhombus-shaped pin fins 94 having corners with an angle α of 90 degrees on the x-y plane. The respective pin fins 94 are provided at regular intervals g such that the respective sides are parallel to the main flow direction MS. The pin fins 94 are arranged in a positive grid state on the x-y plane. The diagonal lines of the respective pin fins 94 are parallel to an arrangement direction AD. FIG. 11 illustrates the rhombus-shaped pin fins 94 having corners with an angle β of greater than 60 degrees and less than 90 degrees on the x-y plane. The respective pin fins 94 are provided at regular intervals g such that the respective sides are parallel to the main flow direction MS. The pin fins 94 are arranged in an oblique grid state on the x-y plane. The diagonal lines of the respective pin fins 94 are parallel to the arrangement direction AD.

The interval g between the respective pin fins 94 is in a range of 0.6 millimeters or greater and 2.0 millimeters or smaller, and preferably in a range of 0.9 millimeters or greater and 1.5 millimeters or smaller, for example. The pin fins 94 may be manufactured by cutting such that the corners of the respective cut side surfaces are either not subjected to any processing or rounded off. The R-dimension of the respective corners when rounded off is 0.5 millimeters or smaller, for example. The cross-sectional area of the respective pin fins 94 on the x-y plane is in a range of 1 square millimeter or greater and 9 square millimeters or smaller. The respective pin fins 94, when having a square shape in the planar view, have a length of each side in a range of 1 millimeter to 3 millimeters. The height of the respective pin fins 94 is in a range of 4 millimeters or greater and 6 millimeters or smaller, for example.

The respective pin fins 94 have an upper end and a lower end opposed to each other in the z-axis direction, and the respective upper ends are thermally and mechanically connected to the bottom surface 24 of the ceiling plate 20 and extend toward the coolant flow part 92 from the bottom surface 24 of the ceiling plate 20. When the pin fins 94 are formed integrally with the ceiling plate 20, the upper ends of the pin fins 94 integrally project from the bottom surface 24 of the ceiling plate 20 and extend toward the coolant flow part 92 from the bottom surface 24 of the ceiling plate 20. The lower ends of the pin fins 94 of this example are fixed to the bottom plate 64 with the binder 98. The lower ends of the pin fins 94 may be separated from the bottom plate 64. Providing a gap between the respective pin fins 94 and the bottom plate 64 does not easily lead to a stress caused between the pin fins 94 and the bottom plate 64 if a warp is caused on the bottom plate 64, for example. The heat generated by the respective semiconductor chips 78 is transferred to the coolant flowing adjacent to the pin fins 94. The coolant thus cools the respective semiconductor chips 78.

As indicated by the broken line in FIG. 4, the fin region 95 in the coolant flow part 92 has a rectangular shape longer in the direction along the long sides 96 than in the direction along the short sides 93 in the planar view. The pin fins 94 may be arranged with the greater number in the direction along the long sides 96 than in the direction along the short sides 93 in the coolant flow part 92 per unit length. For example, a ratio of the number of the pin fins 94 arranged in the direction along the long sides 96 in the coolant flow part 92 and the number of the pin fins 94 arranged in the direction along the short sides 93 in the coolant flow part 92 may be set in a predetermined range. The fin region 95 includes the region in which the pin fins 94 are provided and the flow paths defined between the respective pin fins 94. While the pin fins 94 are arranged in a square matrix as illustrated in FIG. 4, the pin fins 94 may be arranged in a zigzag state instead. The interval between the respective pin fins 94 adjacent to each other may be smaller than the width of the respective pin fins 94. While the U-phase assembly 70U, the V-phase assembly 70V, and the W-phase assembly 70W of this example are provided inside the fin region 95, as illustrated in FIG. 4, the respective assemblies may be partly located on the outside of the fin region 95.

The coolant flow part 92 includes the first header 30-1 and the second header 30-2 arranged to interpose the fin region 95 in the planar view. The respective headers 30 refers to a space having a predetermined height (a length in the z-axis direction) or greater in the coolant flow part 92. The term "predetermined height" may refer to a distance between the ceiling plate 20 and the bottom plate 64.

The first header 30-1 is arranged on one side in the direction along the short sides 93 based on the fin region 95, communicates with the inlet 41 located at the position Pi, and extends in the direction along the long sides 96. The second header 30-2 is arranged on the other side in the direction along the short sides 93 based on the fin region 95, communicates with the outlet 42 located at the position Po, and extends in the direction along the long sides 96. The direction in which the first header 30-1 and the second header 30-2 extend may be parallel to the direction of the long sides 96 of the fin region 95. The first header 30-1 is an example of one of communicating regions, and the second header 30-2 is an example of the other communicating region.

As illustrated in FIG. 4, the arrangement of the plural pin fins 94 in the main flow direction MS may provide a step ST by the plural pin fins 94 along the outer circumference of the fin region 95. The provision of the step ST can regulate the flow of the coolant, so as to improve a distribution of the coolant flow rate in the long-side direction (the y-axis direction) in the fin region 95. The arrangement of the pin fins 94 may provide a plurality of steps ST along the outer circumference of the fin region 95, and the steps ST adjacent to each other may have either the same length or different lengths.

The semiconductor module 100 according to the present embodiment as described above has the configuration in which, in the cooling device 10 mounted on the semiconductor device 70, the main flow direction of the coolant flowing through the coolant flow part 92 having a substantially rectangular shape in cross section on the x-y plane corresponds to the direction of the short sides 93 of the substantially rectangular shape, and the cross-sectional shape of the respective pin fins 94 on the x-y plane arranged in the coolant flow part 92 has a rhombus shape. The semiconductor module 100 according to the present embodiment having the configuration described above can reduce a flow rate loss of the coolant flowing in the coolant flow part 92 so as to improve the heat-releasing efficiency while equally cooling the plural heat sources of the semiconductor device 70 that generate the heat during the operation of the semiconductor module 100.

In the semiconductor module 100 according to the present embodiment, the inlet 41 and the outlet 42 in the cooling device 10 are located at both ends opposed to each other in the coolant flow part 92 in the diagonal direction of the coolant flow part 92 having the substantially rectangular shape on the x-y plane. The pin fins 94 in the fin region 95 are arranged with the greater number in the direction along the long sides 96 than in the direction along the short sides 93 in the coolant flow part 92, and the fin region 95 in the coolant flow part 92 has a substantially rectangular shape longer in the direction along the long sides 96 than in the direction along the short sides 93. The coolant flow part 92 includes the first header 30-1 and the second header 30-2 arranged to interpose the fin region 95 in the planar view. The first header 30-1 is arranged on one side in the direction along the short sides 93 based on the fin region 95 to communicate with the inlet 41, and extends in the direction along the long sides 96. The second header 30-2 is arranged on the other side in the direction along the short sides 93 based on the fin region 95 to communicate with the outlet 42, and extends in the direction along the long sides 96.

In the semiconductor module 100 according to the present embodiment having the configuration as described above, the coolant flowing into the coolant flow part 92 through the inlet 41 hits against the pin fins 94 in the fin region 95, flows toward the outlet 41 located on the opposite side of the inlet 41 in the diagonal direction of the coolant flow part 92 while being dispersed in the first header 30-1, and is discharged through the outlet 42. The semiconductor module 100 according to the present embodiment thus can evenly cool the plural heat sources in the semiconductor device 70 that generate heat during the operation of the semiconductor module 100 more efficiently than a case in which a flow-in port and a flow-out port of the coolant are located at both ends opposed to each other in the coolant flow part 92 in the direction along the short sides 93 ($\theta=0°$).

Figure 12:
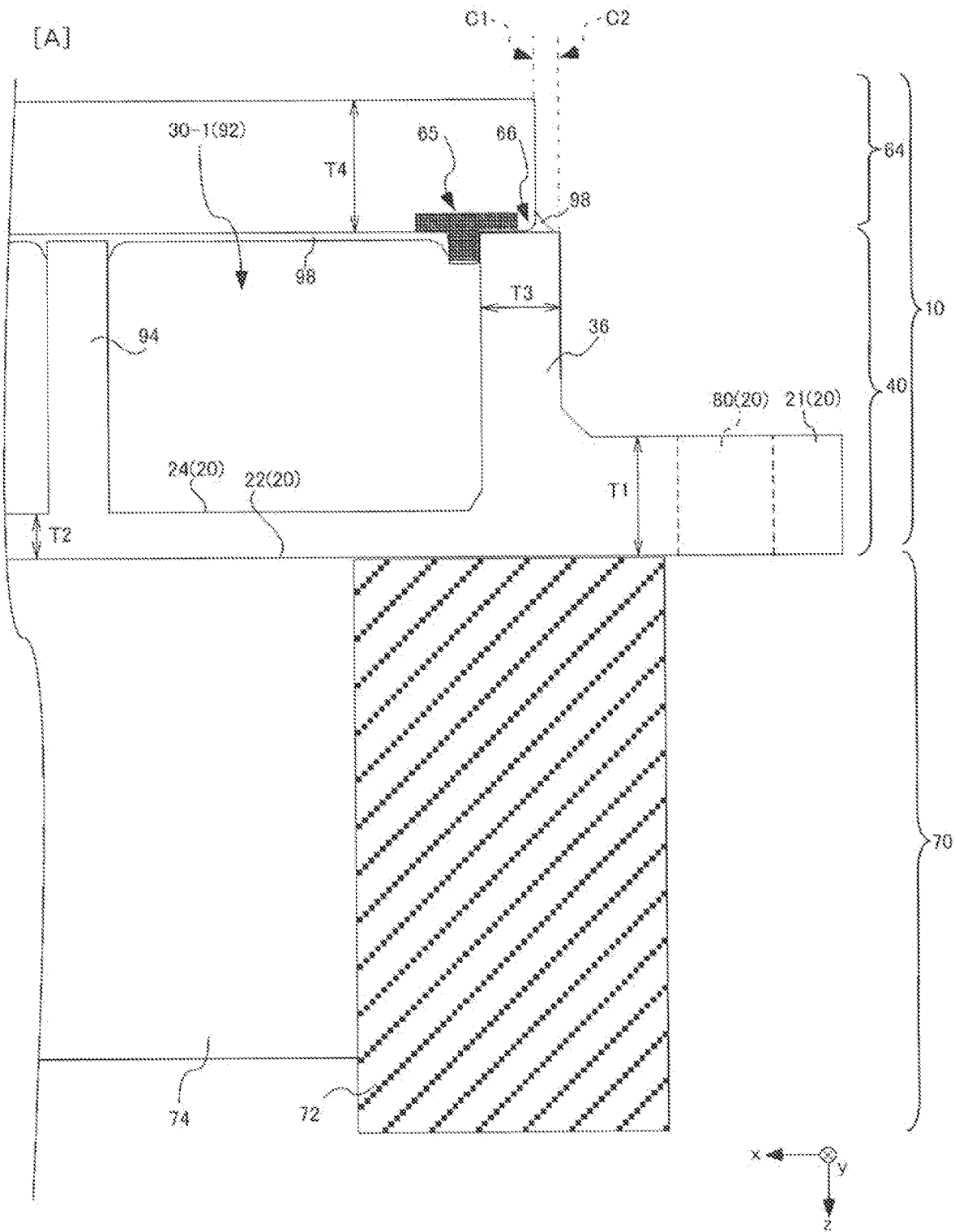
FIG. 12 is a partly-enlarged view of a region A illustrated in FIG. 3.

FIG. 12 is a partly-enlarged view of region A illustrated in FIG. 3. FIG. 12 illustrates the region A rotated 180 degrees from the state in FIG. 3. FIG. 12 indicates the thickness of the fastening part 21 in the ceiling plate 20 in the z-axis direction by T1, indicates the thickness of the fin region 95 in the ceiling plate 20 in the z-axis direction by T2, indicates the thickness of the side wall 36 in the x-axis direction by T3, and indicates the thickness of the bottom plate 64 in the z-axis direction by T4.

As illustrated in FIG. 12, in the cooling device 10 of this example, the thickness T1 of the fastening part 21 may be greater than the thickness T2 of the fin region 95 in the ceiling plate 20. Having a smaller thickness of the fin region 95 in the ceiling plate 20 can efficiently transfer the heat from the semiconductor device 70 arranged on the top surface 22 of the ceiling plate 20 toward the coolant flowing in the coolant flow part 92. In addition, having a greater thickness of the fastening part 21 to enhance the strength can prevent the fastening part 21 from being damaged by strong fastening force that can be applied when the semiconductor module 100 is strongly fastened to the external device with bolts, for example.

The thickness T3 of the side wall 36 may be greater than the thickness T2 of the fin region 95 in the ceiling plate 20. Having a smaller thickness of the fin region 95 in the ceiling plate 20 can increase the cooling efficiency as in the case described above. In addition, having a greater thickness of the side wall 36 connected to the ceiling plate 20 to enhance the strength can prevent deformation of the fin region 95 in the ceiling plate 20 such as a twist caused by a mechanical or thermal influence.

The thickness T4 of the bottom plate 64 may be greater than at least the thickness T2 of the fin region 95 and the thickness T3 of the side wall 36 in the ceiling plate 20. The thickness T4 of the bottom plate 64 may also be greater than the thickness T1 of the fastening part 21 in the ceiling plate 20. As described above, the inlet 41 and the outlet 42 are provided on the bottom plate 64. Providing the inlet 41 and the outlet 42 serving as penetration holes on the bottom plate 64 having the greatest thickness can improve the strength of the cooling device 10 and also facilitate the processing the cooling device 10.

FIG. 12 also indicates the outline of the bottom plate 64 in the planar view by C1, and indicates the outline of the side wall 36 by C2. The outline C1 of the bottom plate 64 in the cooling device 10 of this example may be located on the inside of the outline C2 of the side wall 36.

The stepped part 65 of this example projects from the main surface of the bottom plate 64, and has the outline slightly smaller than the inner circumference of the side wall 36 in the planar view so as to substantially conform to the inner circumference of the side wall 36. The stepped part 65 is thus in contact with the side wall 36 with at least the two different surfaces when the bottom plate 64 and the side wall 36 are fixed to each other, and has a function of defining the position at which the side wall 36 is fixed to the bottom plate 64.

The bottom plate 64 of this example may be rounded at the corners on the side fixed to the side wall 36 in the outline in the planar view. The parts rounded off in the bottom plate 64 can be referred to below as rounded parts 66. When the bottom plate 64 and the side wall 36 are fixed to each other with the binder 98 by brazing, for example, a leakage could be caused upon the brazing to the outside of the fixed region. To deal with this, rounding off the bottom plate 64 to have the rounded parts 66 as described above, and placing the bottom plate 64 to face up in the gravity direction with respect to the side wall 36 as illustrated until the binder 98 is solidified to fix the bottom plate 64 and the side wall 36 to each other can lead the binder 98 to have a region provided with a fillet, so as to prevent a leakage upon the brazing.

The rounded parts 66 may be obtained by either chamfering or rounding-off. The corners at the lower ends of the side wall 36 and the pin fins 94 in the negative direction of the z-axis may be rounded off for the same reasons.

Figure 13:
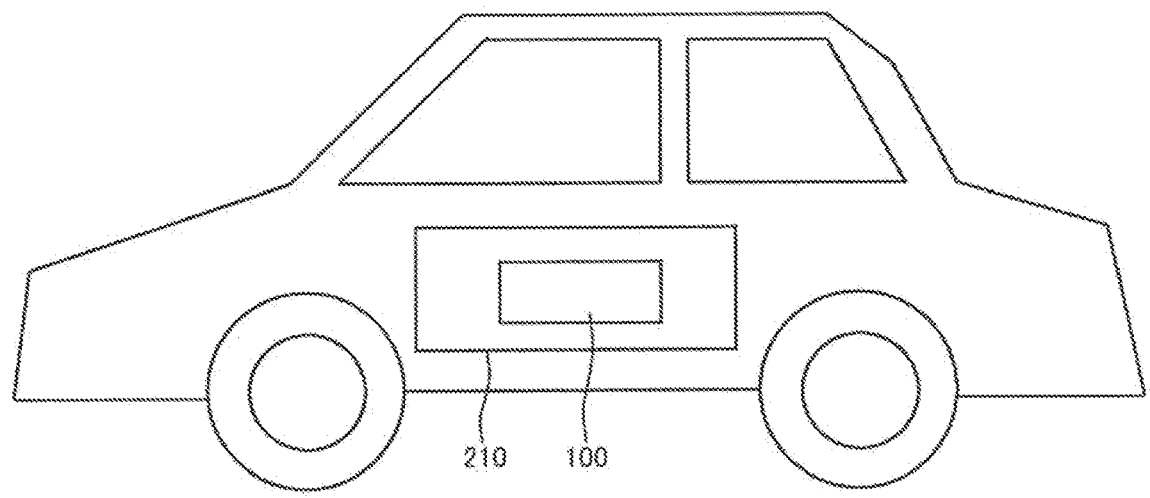
FIG. 13 is a schematic view illustrating a vehicle 200 according to the embodiment of the present invention.

FIG. 13 is a schematic view illustrating a vehicle 200 according to an embodiment of the present invention. The vehicle 200 is a vehicle that generates at least part of propulsive force by use of electric power. For example, the vehicle 200 is an electric vehicle that generates all of the propulsive force by a power drive device such as a motor, or a hybrid vehicle that uses both the power drive device such as a motor and an internal combustion engine that drives with a fuel such as gasoline.

The vehicle 200 includes a control device 210 (an external device) that controls the power drive device such as a motor. The control device 210 is provided with the semiconductor module 100. The semiconductor module 100 may control the electric power supplied to the power drive device.

In the embodiment illustrated in FIG. 4, the side wall 36 of the cooling device 10 may have an octagonal shape on the inner surface in the planar view. In the embodiment, the coolant flow part 92 defined by the side wall 36 may be provided with the first header 30-1 on one side in the short-side direction of the fin region 95 and the second header 30-2 on the other side, and the respective pin fins 94 may be interposed between the first header 30-1 and the second header 30-2. In the embodiment, the pin fins 94 may be arranged in a grid state, preferably in an oblique grid state or a rhombus grid state. In the embodiment, the inlet 41 and the outlet 42 may be arranged adjacent to the fin region 95 and opposed in the diagonal direction in the coolant flow part 92. The respective openings of the inlet 41 and the outlet 42 may be longer in the direction along the long sides 96 than in the direction along the short sides 93 in the planar view.

Figure 14:
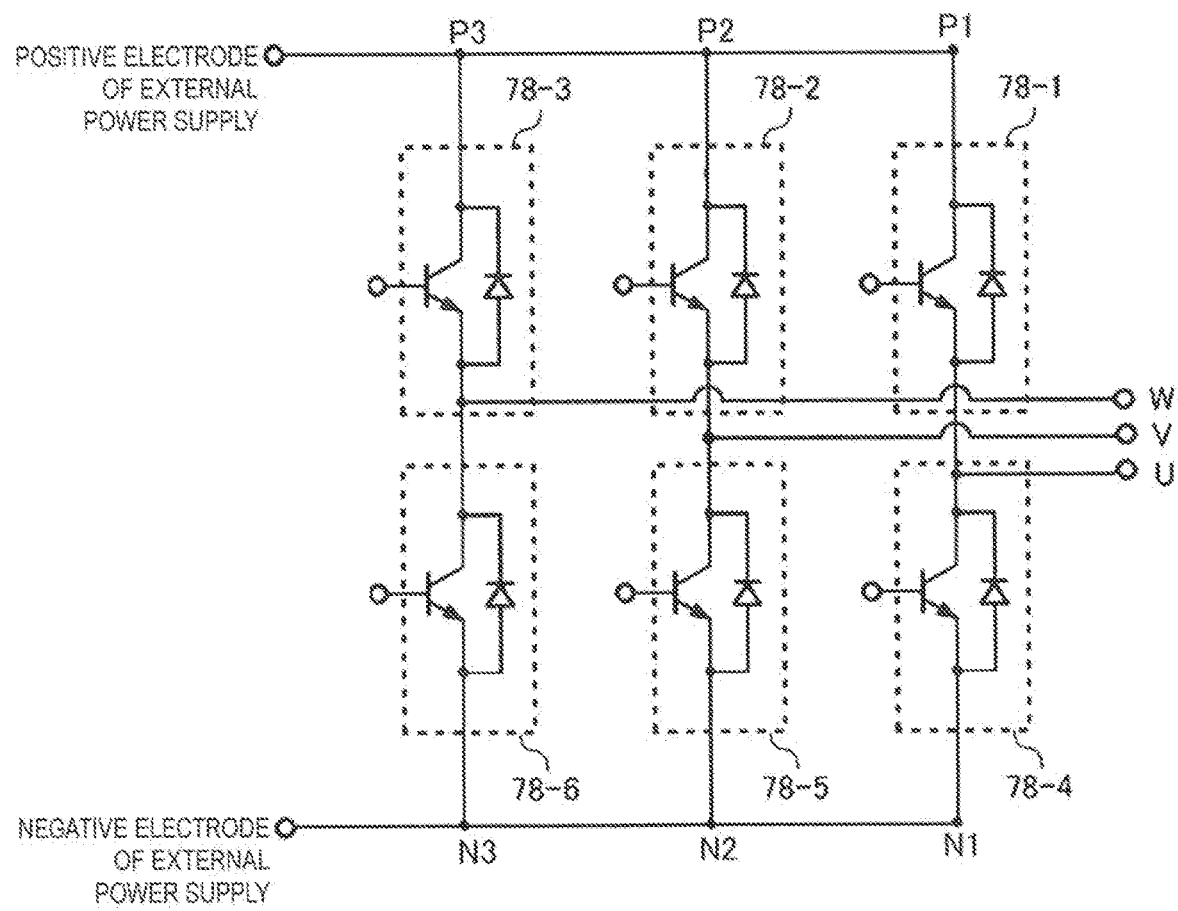
FIG. 14 is a main circuit diagram illustrating the semiconductor module 100 according to the embodiment of the present invention.

FIG. 14 is a main circuit diagram of the semiconductor module 100 according to some embodiments of the present invention. The semiconductor module 100 serves as a three-phase alternating-current inverter circuit including output terminals U, V, and W, and may implement a part of an onboard unit that drives a motor of the vehicle.

In the semiconductor module 100, the semiconductor chips 78-1, 78-2, and 78-3 may implement an upper arm, and the semiconductor chips 78-4, 78-5, and 78-6 may implement a lower arm. A pair of the semiconductor chips 78-1 and 78-4 may implement a leg (a U-phase). Similarly, a pair of the semiconductor chips 78-2 and 78-5 and a pair of the semiconductor chips 78-3 and 78-6 may implement legs (a V-phase and a W-phase). An emitter electrode of the semiconductor chip 78-4 may be electrically connected to an input terminal N1, and a collector electrode may be electrically connected to the output terminal U. An emitter electrode of the semiconductor chip 78-1 may be electrically connected to the output terminal U, and a collector electrode may be electrically connected to an input terminal P1. Similarly, emitter electrodes of the semiconductor chips 78-5 and 78-6 may be electrically connected to input terminals N2 and N3, and collector electrodes may be electrically connected to the output terminals V and W. Similarly, emitter electrodes of the semiconductor chips 78-2 and 78-3 may be electrically connected to the output terminals V and W, and collector electrodes may be electrically connected to input terminals P2 and P3.

The respective semiconductor chips 78-1 to 78-6 may be alternately switched by signals input to the corresponding control terminals. In this example, the respective semiconductor chips 78 may generate heat upon the switching. The respective input terminals P1, P2, and P3 may be connected to positive electrodes of an external power supply, the respective input terminals N1, N2, and N3 may be connected to negative electrodes of the external power supply, and the respective output terminals U, V, and W may be connected to a load. The respective input terminals P1, P2, and P3 may be electrically connected to each other, and the other input terminals N1, N2, and N3 may be electrically connected to each other.

The semiconductor chips 78-1 to 78-6 in the semiconductor module 100 may each be an RC-IGBT (reverse-conducting IGBT) semiconductor chip. The semiconductor chips 78-1 to 78-6 may each include a combination of a transistor such as a MOSFET or an IGBT and a diode.

The terms used with "substantially", such as "substantially the same", "substantially conform to", "substantially uniform", "substantially symmetrical", and "substantially rhombus", to express particular states in some embodiments of the present invention described above intend to not only strictly encompass the corresponding particular states but also substantially encompass the corresponding particular states.

While the present invention has been described above by reference to the embodiment, it should be understood that the technical scope of the present invention is not intended to be limited to the above descriptions. Various modifications and improvements to be made to the embodiment will be apparent to those skilled in the art. It is also apparent to those skilled in the art that the modes to which the modifications and improvements are made are encompassed in the technical scope of the present invention according to the appended claims.

For example, while the embodiment has been illustrated above with the configuration in which the ceiling plate 20, the side wall 36, and the pin fins 94 are integrally formed together in the base plate 40, the ceiling plate 20, the side wall 36, and the pin fins 94 may be fixed to each other with the binder 98 after the respective components are formed independently of each other, or the ceiling plate 20 and the side wall 36 may be integrally formed together so that the pin fins 94 formed independently may be fixed to the ceiling plate 20 and the like afterward, or the ceiling plate 20 and the pin fins 94 may be integrally formed together so that the side wall 36 formed independently may be fixed to the ceiling plate 20 and the like afterward.

For example, while the embodiment has been illustrated above with the configuration in which the pin fins 94 are formed integrally with the ceiling plate 20 and the like and extend toward the bottom plate 64, the pin fins 94 may be formed integrally with the bottom plate 64 and extend toward the ceiling plate 20 and the like from the bottom plate 64 instead. In such a case, gaps between the tip ends of the respective pin fins 94 and the ceiling plate 20 and the like may be filled with the binder 98 or the like to be fixed to each other.

For example, while the embodiment has been illustrated above with the configuration in which the pin fins 94 extend in the normal line of the main surface of the ceiling plate 20 between the ceiling plate 20 and the bottom plate 64, namely, the pin fins 94 extend vertically with respect to the ceiling plate 20 and the bottom plate 64, the pin fins 94 may diagonally extend so as to make an angle with the normal line of the main surface of the ceiling plate 20 between the ceiling plate 20 and the bottom plate 64 instead. The dimensions of the pin fins 94 in cross section on the x-y plane may either be constant or vary in the z-axis direction. In particular, the pin fins 94 may extend from one of the ceiling plate 20 and the bottom plate 64 to the other one so as to be tapered to the tip ends.

For example, while the embodiment has been illustrated above with the configuration in which the semiconductor device 70 is directly fixed to the top surface 22 of the ceiling plate 20 in the cooling device 10, the semiconductor device 70 may include a base plate exposed to the bottom surface of the housing part 72, the circuit substrate 76 may be fixed to the top surface of the base plate, and the base plate may be fixed to the top surface 22 of the ceiling plate 20.

It should be understood that the execution of the respective processing operations, procedures, steps, and stages in the device, system, program, and method illustrated in the appended claims, the specification, and the drawings can be made in an optional order as long as the explanations are not accompanied particularly with the term "prior to" or "preliminarily" or the output in the previous processing is not used in the subsequent processing. It should also be understood that the respective steps of the operations illustrated in the appended claims, the specification, and the drawings are not intended to be limited to the order described therein regardless of whether the explanations are made together with the terms such as "first" and "subsequently" for illustration purposes.

What is claimed is:

1. A semiconductor module including a cooling device, the cooling device comprising:
    a ceiling plate;
    a side wall connected to the ceiling plate;
    a bottom plate opposed to the ceiling plate and connected to the side wall;
    a plurality of pin fins having a polygonal shape and arranged separately from each other in a matrix form in a planar view in which one end of the respective pin fins is connected to a fin region having a rectangular shape and separated from the side wall on a surface of the ceiling plate opposed to the bottom plate;
    an inlet for a coolant having a center of a flow path at a position adjacent to a part of one of long sides of the fin region in the planar view; and
    an outlet for the coolant having a center of a flow path at a position adjacent to a part of another one of the long sides of the fin region in the planar view,
    wherein matrix directions of the respective pin fins make an angle with a straight line connecting the position of the inlet and the position of the outlet,
    a length of a segment of the straight line passing across the fin region is longer than a length of short sides of the fin region, and
    a direction in which an angle with respect to one of the short sides of the fin region increases is defined as a positive direction, and a direction in which an angle with respect to the one of the short sides of the fin region decreases is defined as a negative direction, and one side of the respective pin fins makes an angle with the straight line in a range of −40 degrees or greater and −30 degrees or less or an angle of 30 degrees or greater and 40 degrees or less.

2. The semiconductor module of claim 1, wherein the respective pin fins have a rhombus shape in the planar view.

3. The semiconductor module of claim 1, wherein the respective pin fins have corners having an angle of 90 degrees in the planar view.

4. The semiconductor module of claim 1, wherein a cross-sectional area of the respective pin fins is in a range of 1 square millimeter or greater and 9 square millimeters or smaller.

5. The semiconductor module of claim 1, wherein a height of the respective pin fins is in a range of 4 millimeters or greater and 6 millimeters or smaller.

6. The semiconductor module of claim 1, wherein an interval between the respective pin fins is constant.

7. The semiconductor module of claim 1, wherein an interval between the respective pin fins is in a range of 0.6 millimeters or greater and 2.0 millimeters or smaller.

8. The semiconductor module of claim 1, wherein the respective pin fins have rounded parts at corners in cross section having a radius of curvature of 0.5 millimeters or less.

9. The semiconductor module of claim 1, wherein the straight line makes an angle with the respective short sides of the fin region in a range of 30 degrees or greater and 60 degree or less.

10. The semiconductor module of claim 1, wherein the ceiling plate, the side wall, and the respective pin fins are formed integrally with each other.

11. The semiconductor module of claim 1, wherein another end of the respective pin fins is connected to the bottom plate.

12. The semiconductor module of claim 1, wherein the bottom plate is provided with the inlet and the outlet.

13. The semiconductor module of claim 1, wherein the bottom plate has a greater thickness than any of the ceiling plate and the side wall.

14. The semiconductor module of claim 1, wherein:
    a circuit substrate equipped with a semiconductor chip having a rectangular shape is provided on the ceiling plate; and
    the semiconductor chip is arranged to overlap with a part of the fin region in the planar view such that a longitudinal direction of the semiconductor chip corresponds to a short-side direction of the fin region.

* * * * *